(12) United States Patent
Hsu et al.

(10) Patent No.: US 9,941,220 B2
(45) Date of Patent: Apr. 10, 2018

(54) INTEGRATED CIRCUIT

(71) Applicant: UNITED MICROELECTRONICS CORP., Hsin-Chu (TW)

(72) Inventors: Yung-Tai Hsu, Hsinchu County (TW); Tien-Shang Kuo, Taoyuan (TW); Yen-Chuan Chen, New Taipei (TW); Chih-Hao Cheng, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 104 days.

(21) Appl. No.: 15/008,432

(22) Filed: Jan. 27, 2016

(65) Prior Publication Data

US 2017/0179044 A1 Jun. 22, 2017

(30) Foreign Application Priority Data

Dec. 18, 2015 (CN) ............................ 2015 1 0957726

(51) Int. Cl.

| | |
|---|---|
| *H01L 23/00* | (2006.01) |
| *H01L 23/544* | (2006.01) |
| *H01L 23/58* | (2006.01) |
| *H01L 21/784* | (2006.01) |
| *H01L 21/66* | (2006.01) |

(52) U.S. Cl.
CPC .......... *H01L 23/562* (2013.01); *H01L 21/784* (2013.01); *H01L 23/544* (2013.01); *H01L 23/585* (2013.01); *H01L 22/32* (2013.01); *H01L 2223/5446* (2013.01); *H01L 2224/0401* (2013.01); *H01L 2224/04042* (2013.01); *H01L 2224/131* (2013.01); *H01L 2224/16145* (2013.01); *H01L 2224/16227* (2013.01); *H01L 2224/94* (2013.01); *H01L 2924/10253* (2013.01); *H01L 2924/10271* (2013.01); *H01L 2924/14* (2013.01); *H01L 2924/3512* (2013.01)

(58) Field of Classification Search
CPC ... H01L 23/544; H01L 23/562; H01L 23/585; H01L 21/78; H01L 2924/3512; H01L 2924/10271; H01L 2224/0401; H01L 2224/94; H01L 2224/16227; H01L 2224/04042; H01L 22/32; H01L 2223/5446

See application file for complete search history.

(56) References Cited

U.S. PATENT DOCUMENTS

| | | | |
|---|---|---|---|
| 7,498,660 B2 * | 3/2009 | Kumagai | ................ H01L 21/78 257/620 |
| 7,830,017 B2 | 11/2010 | Lee et al. | |

(Continued)

*Primary Examiner* — Stephen W Smoot
*Assistant Examiner* — Sun M King
(74) *Attorney, Agent, or Firm* — Winston Hsu

(57) ABSTRACT

An integrated circuit includes a scribe line, a bonding pad structure and an extension pad structure. The scribe line is disposed on a substrate, and the bonding pad structure and the extension pad structure are both disposed in a dielectric layer on the substrate. The bonding pad structure includes first vias disposed on first metal layers in the dielectric layer. The extension pad structure includes second metal layers and a number of the second metal layer is less than that of the first metal layers. Also, the bonding pad structure has a first region and a second region, and second vias is disposed on the second metal layers in the first region and no vias is disposed on the second metal layers in the second region.

16 Claims, 7 Drawing Sheets

(56) References Cited

U.S. PATENT DOCUMENTS

| | | | |
|---|---|---|---|
| 8,022,509 B2 * | 9/2011 | Jao | H01L 21/78 |
| | | | 257/618 |
| 8,304,867 B2 | 11/2012 | McCarthy et al. | |
| 8,309,957 B2 | 11/2012 | Chatterjee et al. | |
| 8,912,076 B2 | 12/2014 | West et al. | |
| 2003/0122220 A1 * | 7/2003 | West | H01L 23/562 |
| | | | 257/620 |
| 2009/0108410 A1 * | 4/2009 | Takemura | H01L 21/78 |
| | | | 257/620 |
| 2009/0321890 A1 * | 12/2009 | Jeng | H01L 21/78 |
| | | | 257/620 |
| 2011/0156219 A1 * | 6/2011 | Kawashima | H01L 22/34 |
| | | | 257/620 |
| 2011/0233735 A1 * | 9/2011 | Yoshizawa | H01L 23/585 |
| | | | 257/620 |
| 2013/0323908 A1 * | 12/2013 | Wang | H01L 21/78 |
| | | | 438/462 |

* cited by examiner

INTEGRATED CIRCUIT

BACKGROUND OF THE INVENTION

1. Field of the Invention

The present invention relates to an integrated circuit, and more particularly, to an integrated circuit being enable to avoid chip cracking.

2. Description of the Prior Art

In the modern society, the micro-processor systems composed of integrated circuits (IC) have been utilized in diverse fields such as automatic control electronics, mobile communication devices and personal computers. With the development of technology and the increase of original applications for electrical products, the IC devices are becoming smaller, more delicate and more diversified.

As well known in the art, an IC device is produced from dies that are fabricated by conventional semiconductor manufacturing processes. The process for manufacturing a die starts with a wafer: first, different regions are marked on the wafer; secondly, conventional semiconductor manufacture processes such as deposition, photolithography, etching or planarization are used to form circuit trace(s); then, each region of the wafer is diced to form a die, and the dies are than assembled to form a chip, so as to obtain a complete assembling unit. Finally, the chip is attached onto a board, such as a printed circuit board (PCB) by electrically connecting to the pins of the PCB. By doing so, functions on the chip can be executed accordingly to form numerous electronic devices.

In order to achieve the miniaturization demands, novel packaging process and assembling structure are needed.

SUMMARY OF THE INVENTION

The present invention therefore provides an integrated circuit having an extension pad structure, with the extension pad structure having a via-free region between a bonding pad structure and a scribe line, thereby preventing from chip cracking.

To achieve the purpose described above, the present invention provides an integrated circuit including a scribe line, a bonding pad structure and an extension pad structure. The scribe line is disposed on a substrate. The bonding pad structure is disposed in a dielectric layer on the substrate, wherein the bonding pad structure includes a plurality of first vias disposed on a plurality of first metal layers in the dielectric layer. The extension pad structure is disposed in the dielectric layer, between the scribe line and the bonding pad structure. The extension pad structure includes a plurality of second metal layers and a quantity of the second metal layer is less than a quantity of the first metal layers. Also, the extension pad structure has a first region and a second region, and a plurality of second vias is disposed on the second metal layers in the first region and no via is disposed on the second metal layers in the second region.

According to above, the integrated circuit of the present invention includes an extension pad structure, with the extension pad structure having a via-free region between a bonding pad structure and a scribe line, such that, the integrated circuit of the present invention may enable to transfer the cutting stress into the bonding pad structure while the wafer saw process is performed, thereby avoiding the chip cracking issues.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 2 are schematic diagrams illustrating an integrated circuit according to a preferred embodiment of the present invention, wherein:

FIG. 1 is a schematic top view showing a semiconductor wafer according to the preferred embodiment of the present invention; and FIG. 2 is a schematic cross-sectional view taken along the cross line A-A' in FIG. 1.

FIG. 3 to FIG. 7 are schematic diagrams illustrating an assembling process of an integrated circuit according to a preferred embodiment of the present invention, wherein:

FIG. 3 is a schematic diagram showing an integrated circuit after performing a photolithography and etching process;

FIG. 4 is a schematic diagram showing an integrated circuit after forming a molding material;

FIG. 5 is a schematic diagram showing an integrated circuit after performing another photolithography and etching process;

FIG. 6 is a schematic diagram showing an integrated circuit after forming a metal layer; and FIG. 7 is a schematic diagram showing an integrated circuit after forming another molding material.

DETAILED DESCRIPTION

To provide a better understanding of the presented invention, preferred embodiments will be described in detail. The preferred embodiments of the present invention are illustrated in the accompanying drawings with numbered elements.

Figure 1:
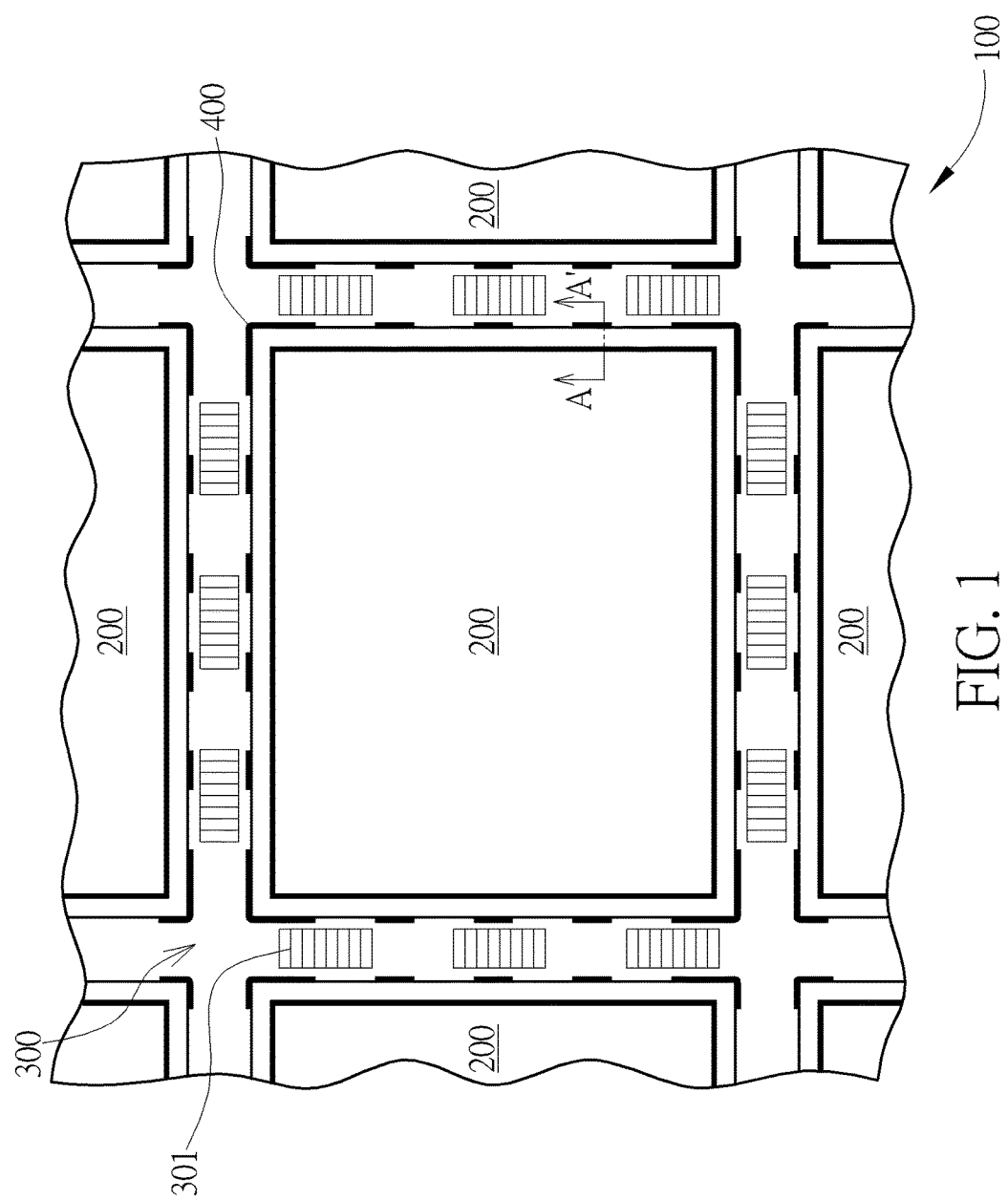
Figure 2:
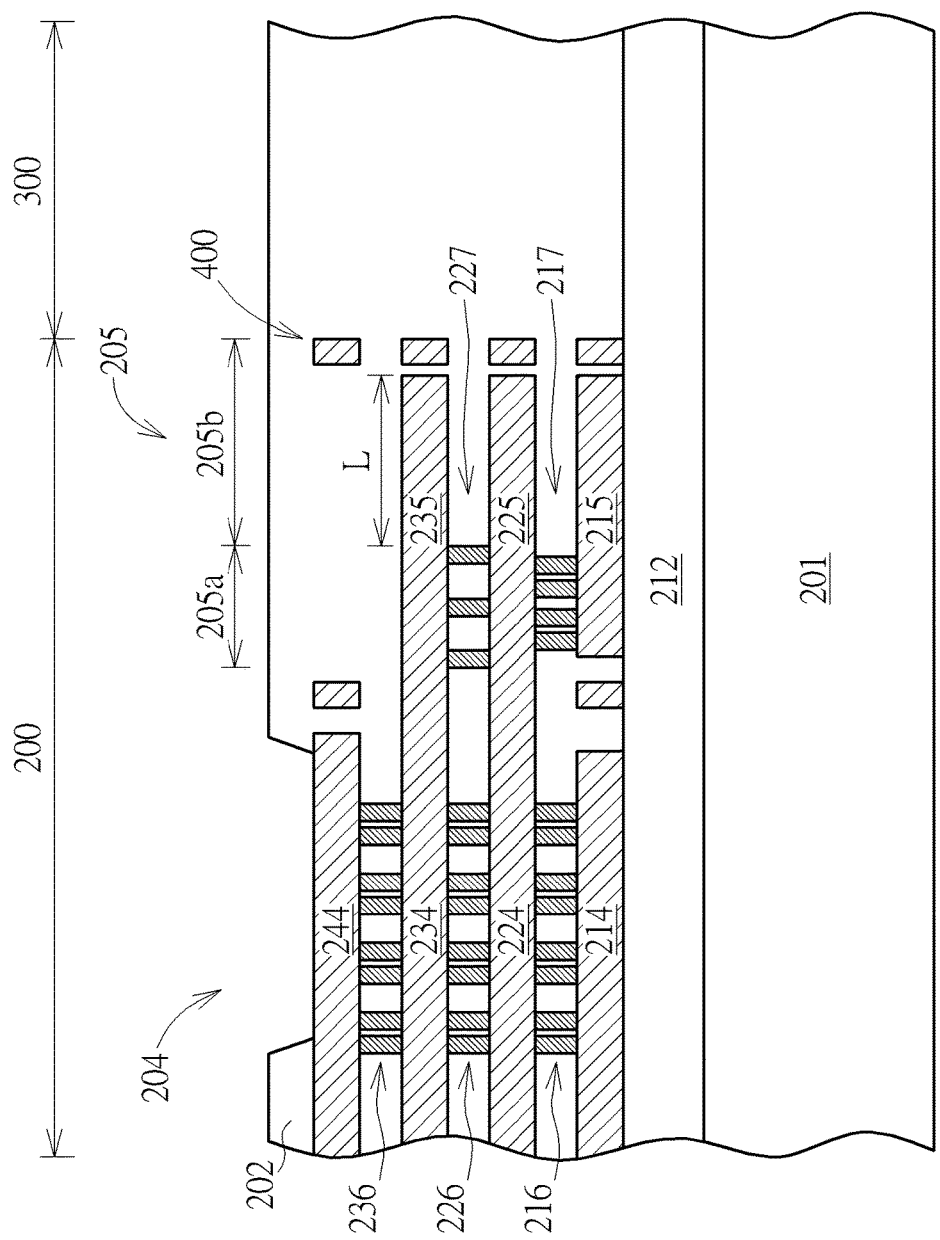

Please refer to FIG. 1 to FIG. 2, which are schematic diagrams illustrating an integrated circuit according to a preferred embodiment of the present invention, in which FIG. 1 is a schematic top view of a semiconductor wafer 100; and FIG. 2 is a schematic cross-sectional view taken along the cross line A-A' in FIG. 1.

As shown in FIG. 1, the semiconductor wafer 100 includes a plurality of die regions 200 surrounded by interlaced scribe lines 300, in which each of the die regions 200 is separated from each other by the scribe lines 300. Also, the semiconductor wafer 100 includes a seal ring 400 between the scribe lines 300 and the die regions 200, in which the seal ring 400 is formed adjacent to and surrounds each of the die regions 200, as shown in FIG. 1. In one embodiment, the die regions 200 may further include elements such as transistor (not shown in the drawings), doped region (not shown in the drawings), metal interconnects (not shown in the drawings) disposed thereon, and each of the die regions 200 may be diced into each die (not shown in the drawings) in the subsequent processes. Also, in another embodiment, the semiconductor wafer 100 may further include a plurality of test key circuits 301 disposed on the scribe line 300, as shown in FIG. 1. However, the test key circuits 301 may also be omitted in other embodiment. Please note that for simplicity purpose only a portion of the die regions 200 is shown, and the actual quantity and arrangement thereof is not limited to what is shown in FIG. 1 and may be further adjusted according to practical requirements.

Each die region 200 includes a semiconductor substrate 201, for example a silicon substrate, a silicon-germanium substrate or a silicon-on-insulator (SOI) substrate, and an inter-metal dielectric (IMD) layer 202 disposed on a surface of the semiconductor substrate 201 (e.g. a top surface thereof). Preferably, the semiconductor substrate 201 may further include active elements such as transistor (not shown in the drawings), formed thereon or therein, and the IMD layer 202 may include a bonding pad structure 204, an extension pad structure 205 and metal interconnects formed therein. The bonding pad structure 204, the extension pad structure 205 and the metal interconnects are all consisted of a plurality of metal layers stacked one over another and a plurality of vias consisted of low-resistant metals, such as copper (Cu), aluminum (Al), or tungsten (W). In one embodiment, the metal layers of the bonding pad structure 204 may optionally connect with the metal layers of the extension pad structure 205, for example, such as the metal layers 224, 234 and metal layers 225, 235 shown in FIG. 2. In other words, the metal layers 224, 234 of the bonding pad structures 204 and the metal layers 225, 235 of the extension pad structure 205 may be formed monolithically and are formed through the same metal fabrication process, but is not limited thereto. In another embodiment, the metal layers of the bonding pad structure 204 may also be not connected with the metal layers of the extension pad structure 205, such as the metal layer 214 and the metal layer 215 shown in FIG. 2.

Additionally, a quantity of the metal layers in the extension pad structure 205 is preferably less than that of the bonding pad structure 204. For example, while the bonding pad structure 204 include "m" layers of the metal layers stacked one over another, the extension pad structure 205 may include "m-n" layers of the metal layers, in which "m" is greater than "n" and not less than 2, and "n" is not equal to zero, but is not limited thereto. In other words, the extension pad structure may also include metal layers in other quantity less than "m" in other embodiments.

In the present embodiment, the bonding pad structure 204 includes four metal layers 214, 224, 234, 244 stacked from bottom to top on the top surface of the semiconductor substrate 201, and vias 216, 226, 236 are formed on the metal layers 214, 224, 234; and the extension pad structure 205 is disposed between the bonding pad structure 204 and the scribe line 300, in which the extension pad structure 205 includes three metal layers 215, 225, 235 stacked from bottom to top on the top surface of the semiconductor substrate 201 and vias 217, 227 are formed on the metal layer 215, 225, as shown in FIG. 2.

It is worth noting that, the extension pad structure 205 has a first region 205*a* adjacent to the bonding pad structure 204, and a second region 205*b* adjacent to the scribe line 300 and the seal ring 400. Also, the vias 217, 227 in the extension pad structure 205 are only formed on the metal layers 215, 225 within the first region 205*a*, as shown in FIG. 2. In other words, no via is formed on the metal layers 215, 225, 235 within the second region 205*b* of the extension pad structure 205. In one embodiment the second region 205*b* of the extension pad structure substantially includes a length L preferably between 20 μm to 40 μm, or more preferably at 36 μm, or about half of the overall length of the extension pad structure 205.

Moreover, a quantity of the vias 217, 227 disposed on the metal layers 215, 225 is preferably decreased by layers, such that, the extension pad structure 205 may include less vias than the bonding pad structure 204. For example, in the first region 205*a* of the extension pad structure 205, the quantity of the vias 227 on the metal layer 225 is less than that of the vias 217 on the metal layer 215, preferably for about 15% less, or the vias 227 may be disposed in a greater pitch in comparison with the vias 217, but is not limited thereto. For example, the quantity of the vias 227 may be about 85% of the quantity of the vias 217. Also, in another embodiment, each die region 200 may further include a interlayer dielectric (ILD) layer 212 disposed between the IMD layer 202 and the semiconductor substrate 201, and active elements (not shown in the drawings) may also be formed on the ILD layer 212 according to practical requirements.

Through the present invention, the integrated circuit according to the preferred embodiment is provided by forming an extension pad structure, in which the extension pad structure has a via-free region disposed between a bonding pad structure and a scribe line. The via-free region has a length L between 20 μm to 40 μm, or more preferably at 36 μm, or about half of the overall length of the extension pad structure. By following this design, the integrated circuit of the present invention enables to transfer the cutting stress into the bonding pad structure while the wafer sawing process is performed, thereby avoiding the chip cracking issues.

Figure 3:
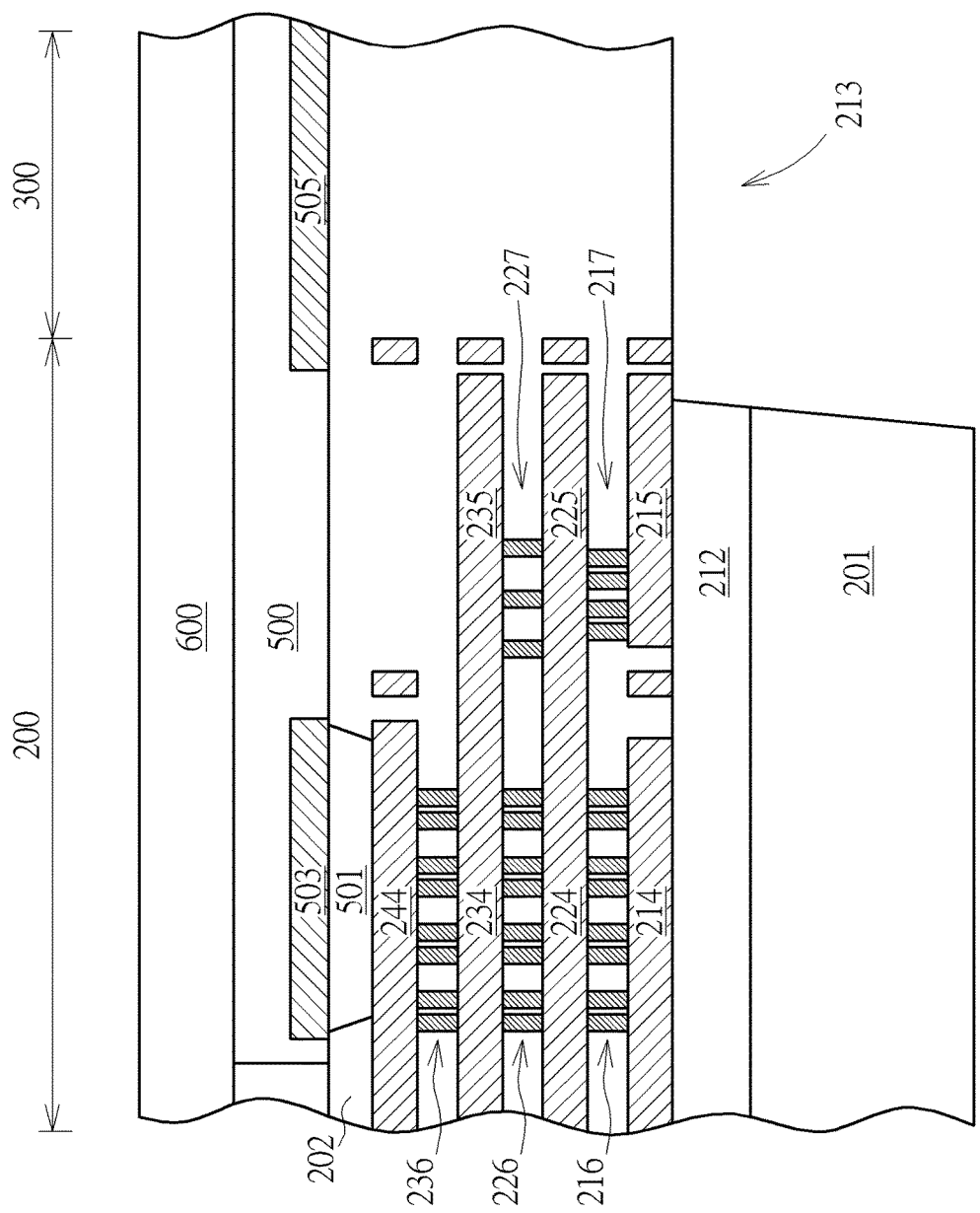

Then, a packaging process shown in FIG. 3 to FIG. 7 may be carried out on the integrated circuit of the present invention. First of all, a thinning process may be performed on the die region 200. For example, a chemical mechanical polishing (CMP) process or an etching process is performed on another surface (such as aback surface) of the semiconductor substrate 201, to reduce the overall thickness of the die region 200, as shown in FIG. 3.

Next, a packaging process is performed to attach the semiconductor wafer 100 to a corresponding die region (not shown in the drawings) of another wafer 500. In the present embodiment, the assembling process refers to any step for electrically connecting the bonding pad structure 204 of the die region 200 to any die region (not shown in the drawings) on the wafer 500. Specifically, the packaging process includes utilizing a surface-mount technology (SMT) to form a bonding element, such as a solder bond or solder ball to electrically connect to the bonding pad structure 204 of the die region 200 and a conductive layer 503 in the corresponding die region of the wafer 500, as shown in FIG. 3, but is not limited thereto. In another embodiment, the packaging process may also be achieved by utilizing other techniques, such as through silicon via (TSV), copper pillar, interposer or wire bonding. Also, in another embodiment, the wafer 500 may be firstly attached to a carrier 600, such as a glass substrate, and then be further assembled to the semiconductor wafer 100, but is not limited thereto. Alternately, in another embodiment, the packaging process may include directly assembling the semiconductor wafer 100 to a corresponding die (not shown in the drawings) or a circuit board (not shown in the drawings).

Next, a first photolithography and etching process (PEP) is performed to remove a portion of the ILD layer 212 and a portion of the semiconductor substrate 201, to form a scribe cavity 213 on the thinned surface (such as the back surface) of the semiconductor substrate 201, in which the scribe cavity 213 is formed in alignment with the scribe line 300, as shown in FIG. 3. It is to be noted that the first PEP only partially removes the semiconductor substrate 201 of the semiconductor wafer 100 but does not etch any portion of the wafer 500.

Figure 4:
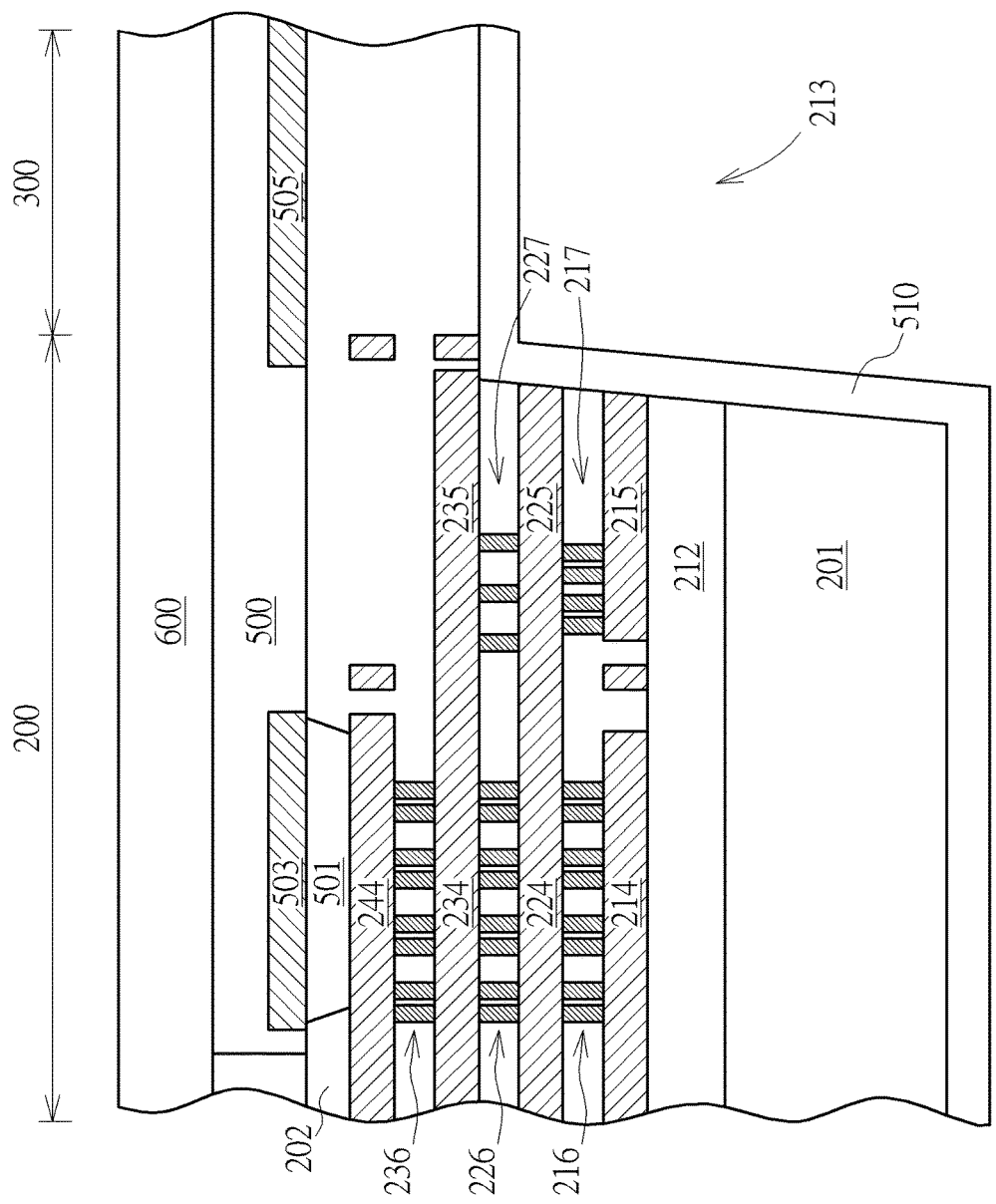

Next, a portion of the IMD layer 202 and the seal ring 400 of the semiconductor wafer 100 are removed, and a molding material 510, such as polymer or benzocyclobutene (BCB)

may be conformally formed on the thinned surface, as shown in FIG. 4. Then, a second PEP is performed to further remove the IMD layer 202 and the seal ring 400 in the semiconductor wafer 100, and to remove a portion of the wafer 500 till exposing a conductive layer 505 on the wafer 500. Thus, a scribe cavity 223 extending from the semiconductor substrate 201 to the wafer 500 may be formed accordingly, as shown in FIG. 5.

Figure 5:
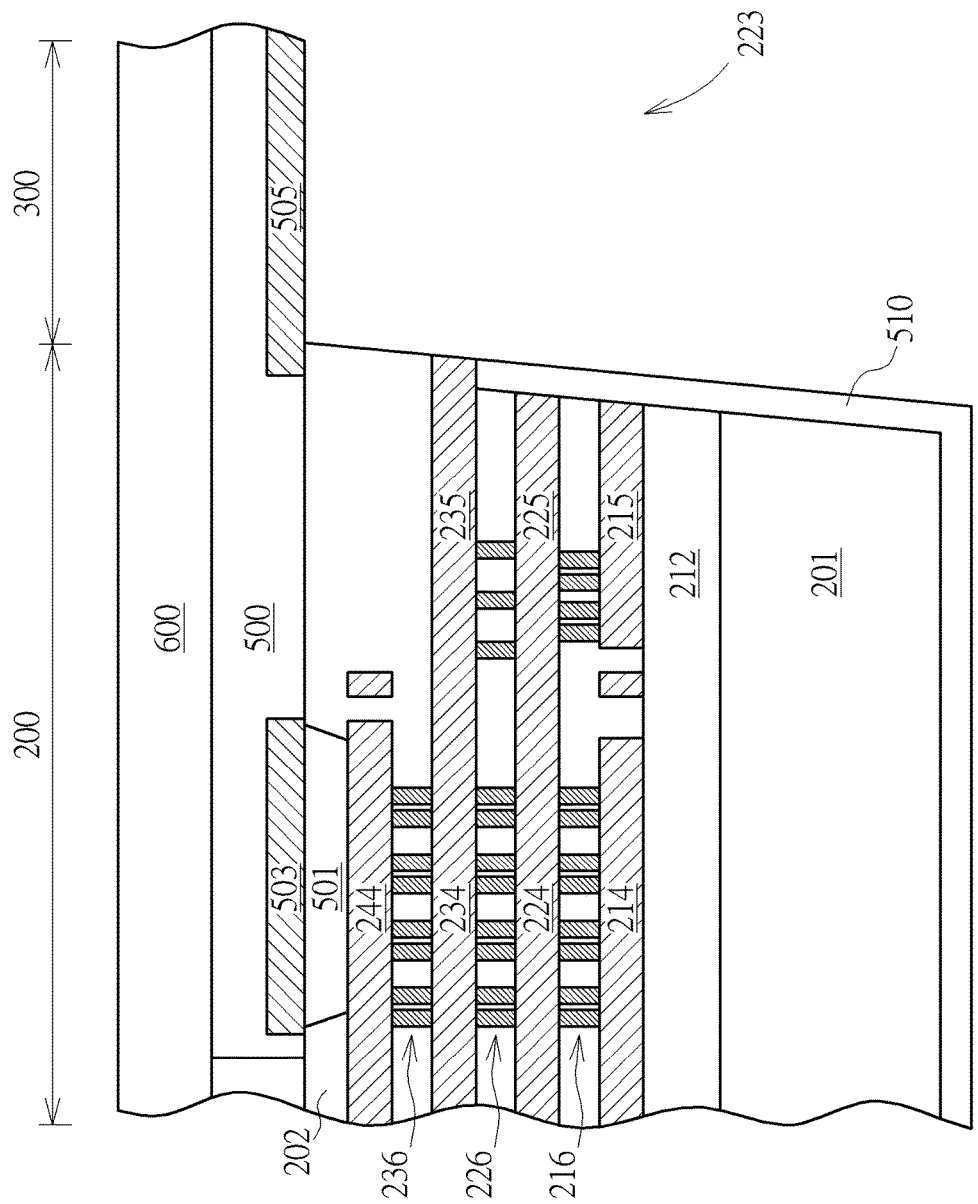
Figure 6:
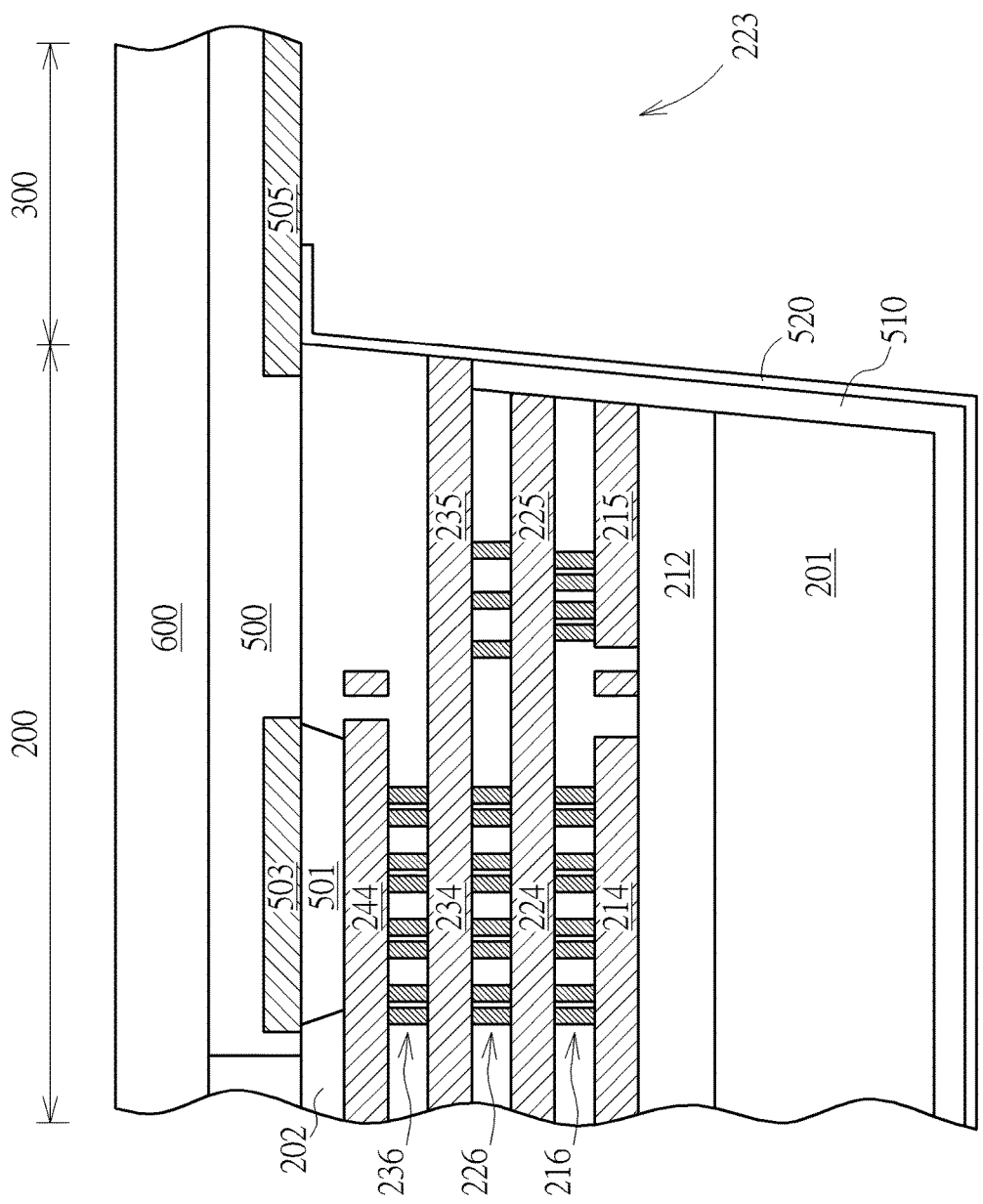

In should also be noted that in addition to expose the conductive layer 505 of the wafer 500 while forming the scribe cavity 223, the top metal layer of the die region 200 (namely, the metal layer most far away from the top surface of the semiconductor substrate 201), such as the metal layer 235 of the extension pad structure 205, may also be exposed from a side of the scribe line 223, as shown in FIG. 5, but is not limited thereto. After that, a metal layer 520 may be formed on the molding layer 510 to electrically connect to the conductive layer 505 and a side of the metal layer 235, as shown in FIG. 6.

Figure 7:
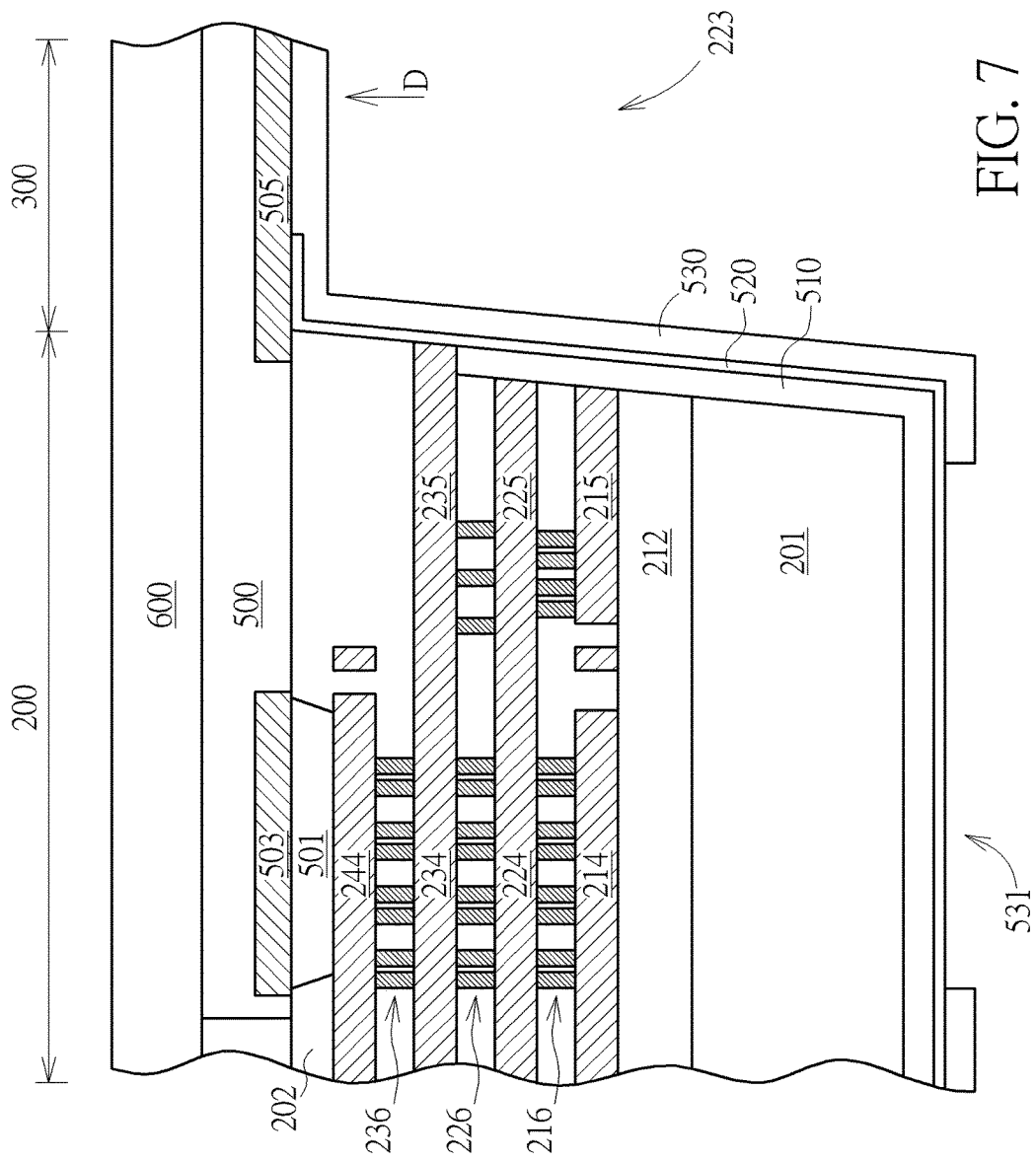

Finally, a molding material 530 is formed to cover a portion of the metal layer 520, as shown in FIG. 7. Through the aforementioned process, the packaging process of an integrated circuit according to the preferred embodiment of the present invention is completed. Then, a wafer sawing process, such as a mechanical sawing process using diamond cutter, a laser cutting process or a mixed process involving mechanical sawing and laser cutting may be performed to saw the semiconductor substrate 201 from the scribe cavity 223 along the sawing direction D (from the back surface to the top surface of the semiconductor substrate 201) for forming a plurality of die arrays (not shown in the drawings). Thereafter, subsequent packaging process may be further carried out to further assemble the die arrays to form a chip electrically connected to a circuit board.

According to the above process, the packaging process according to the preferred embodiment of the present invention is achieved by electrically connecting the bonding pad structure of the semiconductor wafer to another wafer, another die or a conductive region of a circuit board through solder ball and/or metal layers. Accordingly, the semiconductor wafer may be assembled to a corresponding die region of the wafer, the die or the circuit board. Moreover, the integrated circuit of the present invention includes an extension pad structure having a via-free region disposed adjacent to the scribe line, such that, the integrated circuit enable to transfer the cutting stress into the bonding pad structure while the wafer saw process is performed, thereby avoiding the chip cracking issues.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An integrated circuit, comprising:
   a scribe line disposed on a substrate;
   a bonding pad structure disposed in a dielectric layer on the substrate, wherein the bonding pad structure comprises a plurality of first vias disposed on a plurality of first metal layers disposed in the dielectric layer; and
   an extension pad structure disposed in the dielectric layer and between the scribe line and the bonding pad structure, the extension pad structure comprising a plurality of second metal layers and a quantity of the second metal layers being less than a quantity of the first metal layers, wherein the extension pad structure has a first region adjacent to the bonding pad structure and a second region away from the bonding pad structure, and a plurality of second vias are disposed on the second metal layers in the first region and no via is disposed on the second metal layers in the second region.

2. The integrated circuit according to claim 1, wherein the second region is disposed adjacent to the scribe line.

3. The integrated circuit according to claim 1, wherein the second region has a length being half of a length of the extension pad structure.

4. The integrated circuit according to claim 1, wherein the second region has a length between 20-40 μm.

5. The integrated circuit according to claim 1, wherein the first metal layers are stacked with each other according to a quantity "m", and the second metal layers are stacked with each other according to a quantity "m-n", wherein "m" is greater than "n" and "n" is not equal to zero.

6. The integrated circuit according to claim 1, further comprising:
   a seal ring disposed between the scribe line and the extension pad structure.

7. The integrated circuit according to claim 6, wherein the seal ring is disposed adjacent to the second region of the extension pad structure.

8. The integrated circuit according to claim 1, wherein the substrate has a first surface and a second surface, and the dielectric layer is disposed on the first surface of the substrate.

9. The integrated circuit according to claim 8, wherein the scribe line comprises a scribe cavity disposed on the second surface of the substrate.

10. The integrated circuit according to claim 8, wherein a quantity of the second vias above the second metal layers gradually decreases from a location adjacent to the first surface of the substrate to a location away from the first surface of the substrate.

11. The integrated circuit according to claim 10, wherein the second metal layers comprises a first layer and a second layer stacked from another location adjacent to the first surface to another location away from the first surface of the substrate, and a quantity of the second vias disposed on the second layer is 15% less than a quantity of the second vias disposed on the first layer.

12. The integrated circuit according to claim 1, wherein a quantity of the second vias above the second metal layers is less than a quantity of the first vias.

13. The integrated circuit according to claim 1, wherein the substrate further comprises a die region surrounded by the scribe line, the die region comprises the bonding pad structure and the extension pad structure.

14. The integrated circuit according to claim 1, wherein the first metal layers of the bonding pad structure are connected to the second metal layers of the extension pad structure.

15. The integrated circuit according to claim 1, wherein at least one of the first metal layers of the bonding pad structure is not connected to at least one of the second metal layers of the extension pad structure.

16. An integrated circuit, comprising:
   a scribe line disposed on a substrate;
   a bonding pad structure disposed in a dielectric layer on the substrate, wherein the bonding pad structure comprises a plurality of first vias disposed on a plurality of first metal layers disposed in the dielectric layer; and
   an extension pad structure disposed in the dielectric layer and between the scribe line and the bonding pad structure, the extension pad structure comprising a plurality of second metal layers and a quantity of the second metal layers being less than a quantity of the first metal layers, wherein the extension pad structure has a first region and a second region, and a plurality of second vias are disposed on the second metal layers in the first region and no via is disposed on the second metal layers in the second region, wherein the first metal layers of the bonding pad structure are connected to the second metal layers of the extension pad structure, and the first metal layers of the bonding pad structure and the second metal layers of the extension pad structure are monolithic.

\* \* \* \* \*